United States Patent [19]

Kasahara

[11] Patent Number: 4,987,459
[45] Date of Patent: Jan. 22, 1991

[54] VARIABLE CAPACITANCE DIODE ELEMENT HAVING WIDE CAPACITANCE VARIATION RANGE

[75] Inventor: Takeshi Kasahara, Saitama, Japan
[73] Assignee: Toko, Inc., Japan
[21] Appl. No.: 466,244
[22] Filed: Jan. 17, 1990

[30] Foreign Application Priority Data

Jan. 19, 1989 [JP] Japan .................................. 1-10886
Jan. 30, 1989 [JP] Japan .................................. 1-20496

[51] Int. Cl.$^5$ ............................................. H01L 29/92
[52] U.S. Cl. ...................................... 357/14; 357/20; 357/51; 357/89
[58] Field of Search ......................... 357/14, 20, 51, 89

[56] References Cited

U.S. PATENT DOCUMENTS

| | | | |
|---|---|---|---|
| 3,646,411 | 2/1972 | Iwasa | 357/14 |
| 3,891,479 | 6/1975 | Zwernemann | 357/20 |
| 3,909,119 | 9/1975 | Wolley | 357/20 |
| 3,959,809 | 5/1976 | Allison | 357/20 |
| 4,003,009 | 1/1977 | Watanabe | 357/14 |
| 4,106,953 | 8/1978 | Onodera | 357/14 |

FOREIGN PATENT DOCUMENTS

| | | | |
|---|---|---|---|
| 53-144684 | 12/1978 | Japan | 357/14 |
| 56-69869 | 6/1981 | Japan | 357/14 |
| 56-90566 | 7/1981 | Japan | 357/20 |
| 58-50781 | 3/1983 | Japan | 357/14 |
| 62-101076 | 5/1987 | Japan | 357/23.4 |
| 63-138779 | 6/1988 | Japan | 357/20 |

*Primary Examiner*—Rolf Hille
*Assistant Examiner*—Minh Loan Tran T.

[57] ABSTRACT

A variable-capacitance diode element having a wide capacitance variation range is disclosed which comprises an epitaxial layer of a first conductivity type which is provided on a semiconductor substrate of the first conductivity type; a diffusion layer of the first conductivity type which is formed in the epitaxial layer with a higher concentration than said epitaxial layer by means of ion implantation; at least one diffusion layer of a second conductivity type which is formed in the diffusion layer of the first conductivity type so as to define PN junction; and a first-conductivity type buried layer of a low resistivity which is formed the boundary portion between the semiconductor substrate and the epitaxial layer where a depletion layer reaches which occurs in response to a reverse bias voltage being applied to the PN junction, whereby the depletion layer is caused to extend to a maximum possible effect.

5 Claims, 4 Drawing Sheets

(a)

(b)

(c)

(a)

(b)

(c)

(d)

(a)

(b)

(c)

(d)

(e)

VARIABLE CAPACITANCE DIODE ELEMENT HAVING WIDE CAPACITANCE VARIATION RANGE

BACKGROUND OF THE INVENTION

1. Field of the Invention

This invention relates to a variable-capacitance diode element, and more particularly it pertains to such a diode element which is improved in respect of variation tendency of the capacitance-voltage characteristic thereof and has the high-frequency serial resistance $R_s$ reduced so as to represent an enhanced quality factor Q.

2. Description of the Prior Art

Generally, most variable-capacitance diode elements are fabricated in the form of planar construction. Description will now be made of a conventional variable-capacitance diode element with reference to a fabricating process as illustrated in FIGS. 1 to 3.

In FIG. 2, an N-type semiconductor substrate 1 having a lower resistivity is prepared which is provided, by means of a vapor-phase growth process, with an N-type epitaxial layer 2 having a higher resistivity than that of the semiconductor substrate 1, say about 1 Ωcm and a thickness of about 4–5 μm (FIG. 2(a)). A major surface of the epitaxial layer 2 is subjected to a thermal oxidization treatment so that a thermally oxidized film (SiO$_2$) 3 is formed in a thickness of about 1 μm, and then an opening portion 6 is formed in the film 3 by means of an etching process. Subsequently, by means of an ion implantation process and under such conditions as acceleration voltage of 130 KeV and dosage of $(2 \text{ to } 3) \times 10^{13}$ cm$^{-2}$, an N-type impurity element is implanted into the the epitaxial layer 2 through the opening portion 6 through which the major surface of the epitaxial layer 2 is exposed, thereby forming an N-type diffusion layer. It is also possible that the ion implantation may be effected in such a manner that the impurity element is implanted through an oxide film of 100–3000 Å. Thereafter, the resultant composite structure is subjected to a heat treatment which also serves to effect annealing for recovery of latice defects resulting from the ion implantation and carrier recovery, thus resulting in an N$^+$-type diffusion layer 4 being formed which has a higher impurity concentration than that of the aforementioned epitaxial layer (FIG. 2(b)). Subsequently, a P$^{++}$-type diffusion layer 5 is formed which has a smaller diffusion length than that of the diffusion layer 4 and covers the exposed portion of the diffusion layer 4 in such a manner that a PN junction is defined between the diffusion layer 5 and the diffusion layer 4 and epitaxial layer 2 (FIG. 2(c)). Electrodes are then provided at the top and bottom of the resulting composite structure respectively, and in this way, a variable-capacitance diode element is provided.

With the conventional variable-capacitance diode element, assuming that the impurity concentration of the P-type diffusion layer 5 is sufficiently higher than that of the N$^+$-type diffusion layer 4 and epitaxial layer 2, the width of depletion layer in the P-type diffusion 2, when a reverse bias voltage $V_R$ is applied, becomes very small, i.e., negligible as compared with the width of depletion layer extending in the N$^+$-type diffusion layer 4 and epitaxial layer 2. To explain with reference to FIG. 1, the variable capacitance $C_j$ of the variable-capacitance diode element is considered to consist of a combination of a junction capacitance $C_{j1}$ due to a depletion layer 9 occurring due to the PN junction between the N-type diffusion layer 4 and the P-type diffusion layer 5 and a junction capacitance $C_{j2}$ due to a depletion layer 10 resulting from the PN junction between the epitaxial layer 2 and the P-type diffusion layer 5. The impurity concentration of the epitaxial layer 2 is lower than that of the N-type diffusion layer 4 so that the width of the depletion layer 8 of the epitaxial layer becomes greater than that of the depletion layer 7 of the diffusion layer 4.

As well known in the art, by varying the applied voltage $V_R$, the width of the depletion layer 7, 8 is increased or decreased so that the capacitance $C_{j1}$, $C_{j2}$ is varied, thus resulting in variation in the variable capacitance $C_j$ which consists of a combination of the capacitances $C_{j1}$ and $C_{j2}$ as mentioned above.

The variable capacitance of the variable-capacitance diode element is given by the following expressions:

$$W_j \propto \frac{2 K_s \epsilon_o \cdot (\Phi_B + V_R)^{1/n}}{qN(x)} \quad (1)$$

$$C_j \propto \frac{K_s \epsilon_o A}{W_j} \quad (2)$$

where $W_j$ is the width of depletion layer; N (x) is the impurity concentration; $K_s$ is the dielectric constant of the semiconductor substrate; $\epsilon_o$ is the dielectric constant in a vacuum $(8.85 \times 10^{-12}$ F/m$^2)$; q is electron charge $(1.60 \times 10^{-19}$ C); $\Phi_B$ is the diffusion potential at the PN junction; n is a constant determined from the concentration gradient of the impurity element in the diode element; and A is the area of the diode element.

It will be seen from Equations (1) and (2) that the width of depletion layer depends on the impurity concentration of the semiconductor layer forming the PN junction with the P-type diffusion layer 5. If a reverse bias voltage $V_R$ is applied to the variable capacitance diode element, then the width $W_{j2}$ of the depletion layer 8 in the epitaxial layer 2 the impurity concentration of which is lower than that of the diffusion layer, becomes greater than the width $W_{j1}$ of the depletion layer extending in the diffusion layer 4; and as the applied voltage $V_R$ is increased, the depletion layer is caused to extend until it contacts the semiconductor substrate 1, and no further extension thereof is permitted. Thus, the so-called capacitance-voltage characteristic of the diode element represents saturation tendency.

To explain about such saturation, reference will be made to FIG. 3 showing the capacitance-voltage characteristics. With the conventional variable-capacitance diode element, as shown at (I) in FIG. 3, when the applied voltage $V_R$ exceeds about 15 volts (V$_1$) the gradient of the characteristic curve becomes gentle; thus the curve represents saturation tendency with the applied voltage of V$_1$, and the capacitance becomes saturated at C$_s$. Obviously, such conventional variable-capacitance diode element is disadvantageous in that hte range of variation of the capacitance $C_j$ with the applied voltage is decreased due to the depletion layer extending from the periphery of the N$^+$type diffusion layer 4.

To eliminate the foregoing drawback, the thickness t of the epitaxial layer 2 is increased so that the depletion layer can be prevented from coming into contact with the semiconductor substrate 1 when the applied voltage becomes equal to V$_2$. In contrast thereto, however, this is disadvantageous in that due to the fact that the thickness of the epitaxial layer 2 lying immediately below the diffusion layer 4 is increased, the high-frequency serial resistance $R_s$ is increased so that the quality factor Q is decreased. For this reason, it is not allowed to make the epitaxial layer 2 thicker than in the prior art.

SUMMARY OF THE INVENTION

Accordingly, it is an object of the present invention to provide a variable-capacitance diode element which is improved in respect of saturation tendency of the capacitance-voltage characteristic over the prior art, thereby achieving a wide capacitance variation range.

Another object of the present invention is to provide a variable-capacitance diode element which is so designed that the above-mentioned saturation tendency is improved; the high-frequency serial resistance $R_s$ is decreased; and the quality factor Q is not lowered or rather enhanced.

According to an aspect of the present invention, there is provided a variable-capacitance diode element wherein an N type semiconductor substrate is provided with an N type epitaxial layer doped with an impurity element in a lower concentration than the N type semiconductor substrate; an N type diffusion layer is formed in the epitaxial layer with a higher impurity concentration than the epitaxial layer; at least one P type diffusion layer is formed in the N type diffusion layer with a higher impurity concentration so that PN junction is defined therebetween; and an N type buried layer having a low resistivity is provided in a boundary portion between the semiconductor substrate and the epitaxial layer where a depletion layer which is caused to occur due to a reverse bias voltage applied to the PN junction reaches the semiconductor substrate, thereby achieving a wide capacitance variation range and high quality factor.

DESCRIPTION OF THE PREFERRED EMBODIMENTS

Figure 2:
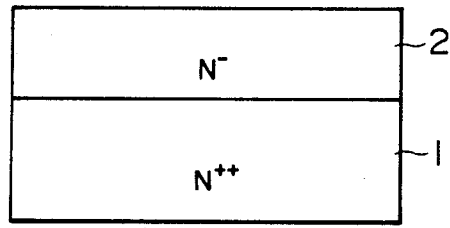
FIGS. 2(a) to (c) are sectional views useful for explaining the outline of a process of making the conventional variable-capacitance diode element.
Figure 1:
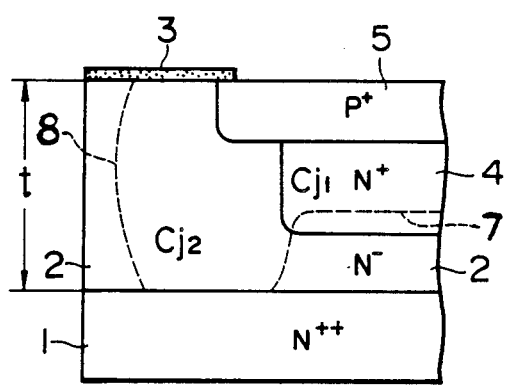
FIG. 1 is a fragmentary sectional view illustrating an example of the conventional variable-capacitance diode element.
Figure 1:
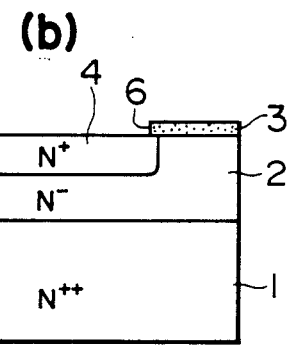
Figure 1:
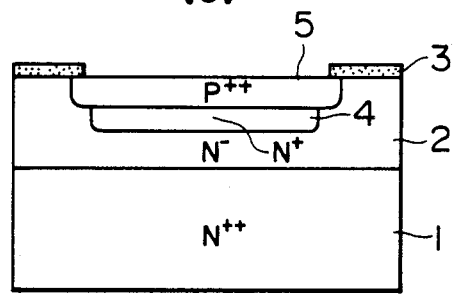

Description will first be made of the variable-capacitance diode element according a first embodiment of this invention with reference to FIGS. 4(a) to (d) showing an example of method of making the diode element.

$N^-$ type diffusion layer 13, which is adapted to serve as buried layer, is formed in an $N^{++}$ type semiconductor substrate 1 having a low resistivity by means of ion implantation using a thermally oxidized film 11 as a mask. The diffusion layer 13 is formed in such a manner as to be located peripherally and except immediately below a diffusion layer 16 which will be formed at a later step. More specifically, the diffusion layer 13 adapted to serve as buried layer is provided in a portion where depletion layer reaches the semiconductor substrate 1 (FIG. 4(a)). Provided on the semiconductor substrate 1 by means of vapor-phase growth is an $N^-$ type epitaxial layer 2 having a resistivity as high as about 1 Ωcm. For the case where the diode element is intended to be used in the high-frequency range, the thickness of the epitaxial layer 2 is set in the range of about 4 to 5 μm as in the prior art. Needless to say, such thickness depends on the electric characteristics of the element. The buried layer 13 is formed at this step of fabrication. The buried layer 13 comprises an $N^{31-}$ type of $N^-$ type semiconductor layer having a lower resistivity than that of the semiconductor substrate 1 (FIG. 4(b)). A thermally oxidized film ($SiO_2$ film) 14 adapted to serve as a surface protection film having a thickness in the range of 1 μm, is formed on the major surface of the epitaxial layer 2 by means of thermal oxidization, and then an opening portion 15 is formed in the film by means of etching. An N-type impurity element such as phosphorus, arsenic or the like is implanted through the opening portion 15 into the epitaxial layer 2 by means of ion implantation under such conditions as acceleration voltage of 130 KeV and dosage of $(2 \text{ to } 3) \times 10^{13}$ ions $cm^{-2}$. Thereafter, for recovery of latice defects resulting from the ion implantation and carrier recovery, an annealing procedure is carried out, and thermal diffusion is effected so that a diffusion layer 16 is formed (FIG. 4(c)). A thermally oxidized film formed through this diffusion step is removed in such a manner as to form an opening portion 17; then a P type impurity element such as boron or the like is implanted through the opening portion 17 by means of ion implantation under such conditions as acceleration voltage of 20 KeV and dosage of $(5 \text{ to } 8) \times 10^{13}$ ions $cm^{-2}$; and thereafter the resulting composite structure is subjected to a heat treatment so that a diffusion layer 18 is formed in such a manner as to cover the $N^+$ type diffusion layer 16 (FIG. 4(d)). Subsequently, electrodes are provided by coating conductive films onto the top and bottom surfaces of the composite structure. In this way, the variable-capacitance diode element is produced.

With the variable-capacitance diode element according to this invention which is manufactured through the manufacturing steps shown in FIG. 4, when voltage $V_R$ is applied, depletion layer is caused to occur in such a width $W_j$ that there occur a depletion layer 9 immediately below the PN junction $J_1$, and another depletion layer 10 due to the PN junction $J_2$ between the $P^{++}$ type diffusion layer 18 and $N^-$ type epitaxial layer 2. As the applied voltage $V_R$ is increased, the depletion layer 10 is caused to reach and extend into the buried layer 13 deeply from the major surface of the semiconductor substrate 1 so that saturation can be prevented from occurring at the major surface of the semiconductor substrate 1. Thus, assuming that the thickness t of the epitaxial layer 2 is substantially the same as in the prior art, the high-frequency serial resistance $R_s$ is not increased; the quality factor Q is not decreased; and the capacitance variation range is increased, even if the thickness t of the epitaxial layer 2 below the diffusion layer 16 is substantially the same as in the prior art.

Figure 3:
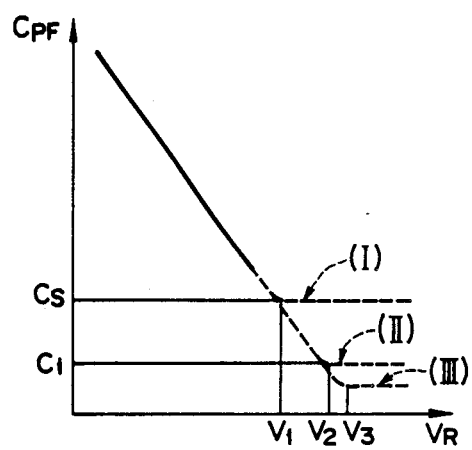
FIG. 3 is a view useful for explaining about the capacitance-voltage characteristic of variable-capacitance diode element.
Figure 3:
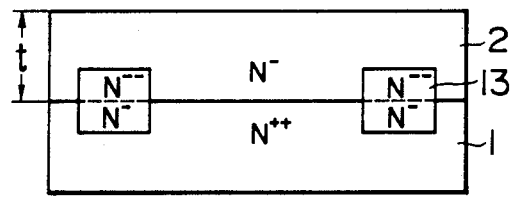
Figure 3:
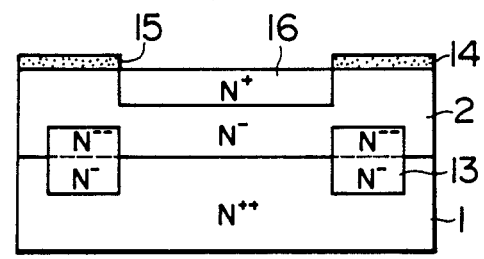
Figure 3:
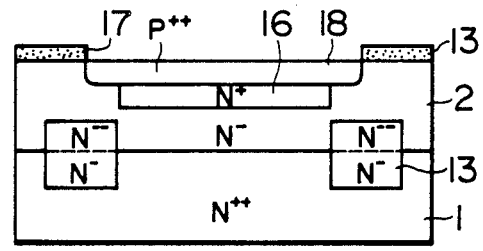

Referring to FIG. 3, with the conventional variable-capacitance diode element, the voltage-junction capacitance characteristic is such that the capacitance $C_s$ becomes saturated with the applied voltage of $V_1$ as shown at (I) in FIG. 3. In contrast thereto, with the variable-capacitance diode element according to the present invention, the depletion layer is caused to extend until the applied voltage $V_2$ is reached, as shown at (II) in FIG. 3, so that the capacitance variable range can be increased even if the thickness of the epitaxial layer 2 is substantially the same as in the prior art.

As will readily be appreciated, according to the present invention, it is possible to make the epitaxial layer 2 thinner than in the prior art by providing the buried layer 13; thus the high-frequency serial resistance $R_s$ can be decreased so that the quality factor Q can be improved over the prior art.

Figure 4:
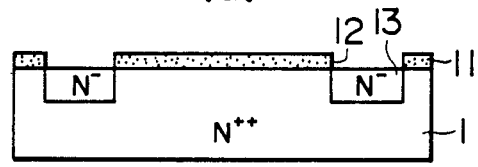
FIGS. 4(a) to (d) are sectional views useful for explaining the variable-capacitance diode element according to an embodiment of the present invention, in terms of various steps for making the diode element.
Figure 6:
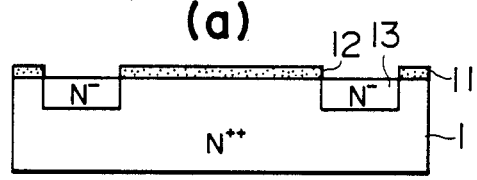
FIGS. 6(a) to (e) are sectional views useful for explaining the variable-capacitance diode element according to a second embodiment of the present invention, in terms of various steps for making the diode element.
Figure 6:
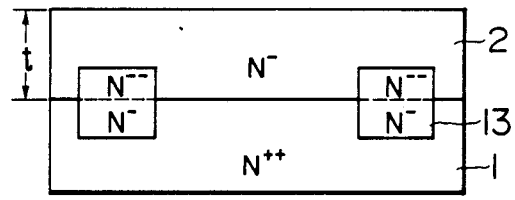
Figure 5:
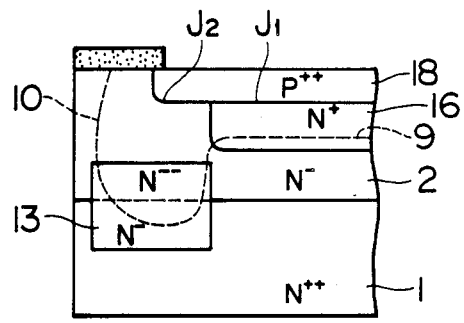
FIG. 5 is a fragmentary sectional view useful for explaining the capacitance characteristic of the variable-capacitance diode element shown in FIG. 4.
Figure 5:
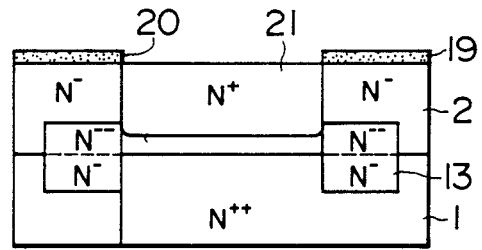
Figure 5:
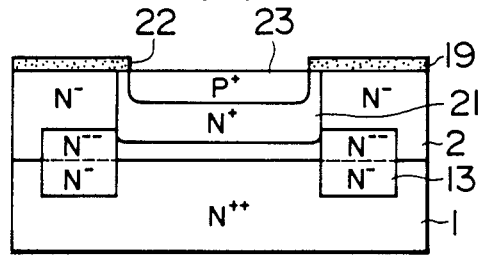
Figure 5:
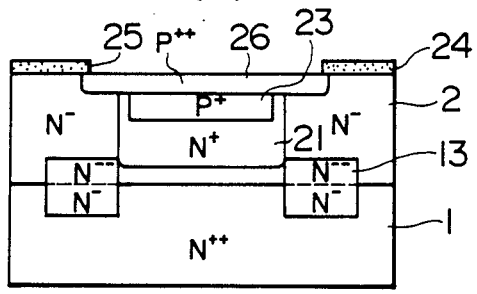

Referring to FIG. 6, there is shown the variable-capacitance diode element according to a second embodiment of the present invention, which is so designed that the high-frequency serial resistance $R_s$ is decreased and the quality factor Q is enhanced more greatly than in the embodiment of FIG. 4. A thermally oxidized film ($SiO_2$ film) 11 is provided on an N++ type semiconductor substrate 11; an opening portion 12 is oxide film 11; and an N− type buried layer 13 is formed in the peripheral portion of the semiconductor substrate 1 and except immediately below a diffusion layer which will be formed at the next diffusion step (FIG. 6(a)). Subsequently, the oxide film 11 is removed; and thereafter the N++ type semiconductor substrate 1having a low resistivity is provided with an N type epitaxial layer 2 having a higher resistivity than that of the semiconductor substrate 1, say about 1 Ωcm for example and a thickness in the range of 4 to 5 μm (FIG. 6(b)). A thermally oxidized film ($SiO_2$ film) 19 which is adapted for surface protection, is formed in a thickness in the range of about 1 μm on the major surface of the epitaxial layer 2 by means of thermal oxidization process; and thereafter the thermally oxidized film 19 is removed in such a manner as to form an opening portion 20. Subsequently, an N type impurity element such as phosphorus, arsenic or the like is implanted through the opening portion 20 into the epitaxial layer 2 under such conditions as acceleration voltage of 130 KeV and dosage of $(2 \text{ to } 3) \times 10^{13}$ ions $cm^{-2}$. Thereafter, the resultant composite structure is subjected to an annealing treatment for recovery of latice defects resulting from the ion implantation and carrier recovery, thereby forming a diffusion layer 21 having a diffusion length of 2 to 3 μm (FIG. 6(c)). A thermally oxidized film formed in the opening portion 20 during this diffusion step is removed in such a manner as to form an opening portion 22. A P type impurity element such as boron or the like is implanted through this opening portion 22 into the diffusion layer 21 by means of ion implantation under such conditions as acceleration voltage of 100 KeV and dosage of $(5 \text{ to } 8) \times 10^{13}$ ions $cm^{-2}$, thereby forming a diffusion layer 23 in the diffusion layer 21 (FIG. 6(d)). It is also possible that self-alignment procedure may be resorted to which is capable of effecting diffusion by using the opening portion 20 formed with the thermally oxidized film, without providing the opening portion 22. Thereafter, the thermally oxidized film is removed in such a manner as to form an opening portion 25 through which the diffusion region in the major surface of the diffusion layer 21 is exposed. A P type impurity element such as boron or the like is implanted through the opening portion 25 by means of ion implantation under such conditions as acceleration voltage of 20 KeV and dosage of $(5 \text{ to } 8) \times 10^{13}$ ions $cm^{-2}$, thereby forming a shallow P++ type diffusion layer 26 (FIG. 6(e)). This diffusion layer 26 is formed by effecting recovery of latice defects resulting from the ion implantation and carrier recovery, by means of shallow diffusion technique, or lamp-annealing process which is quick-heating process using infrared radiation, or the like. Subsequently, electrodes are provided by coating conductive films onto the top and bottom surfaces of the resultant composite structure.

Figure 7:
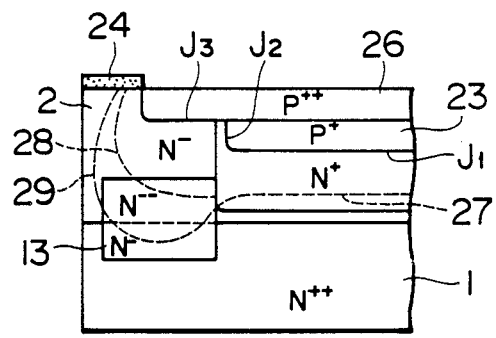
FIG. 7 is a fragmentary sectional view useful for explaining the capacitance characteristic of the variable-capacitance diode element shown in FIG. 6.

With the variable-capacitance diode element shown in FIG. 6, when the reverse bias voltage $V_R$ is applied, the depletion layer is caused to extend in such a width $W_j$ that a depletion layer 27 is caused to extend immediately below the PN junction $J_1$ and another depletion layer due to PN junction $J_3$ defined between the N− type epitaxial layer 2 and the P++ type diffusion layer 26, is caused to exten vertically, as shown in FIG. 7. However, the extension of the vertical depletion layer is restrained by the extension of the lateral depletion layer due to the PN junction $J_2$ defined between the P++ type diffusion layer N+ type diffusion layer 21. Combination of the depletion layers occurring due to the PN junctions $J_2$, $J_3$ is indicated as depletion layer 28. As shown in FIG. 7, the vertical extension of the depletion layer 27 and that of the depletion layer 28 are substantially in proportionment with each other; and as the applied voltage $V_R$ is increased, the depletion layer 28 is caused to extend vertically into the buried layer 13 as shown at 29.

With the variable-capacitance diode element according to the embodiment of FIG. 6, the capacitance variable range of the capacitance-voltage characteristic thereof is extended so that the reverse bias voltage $V_R$ can be increased up to $V_3$ as shown at (III) in FIG. 3. Thus, the voltage Vs with which the capacitance $C_j$ becomes saturated, can be made to be higher than in the prior art, without increasing the thickness t of the epitaxial layer 2. In addition, by virtue of the fact that the epitaxial layer 2 can be made to be thinner by providing the buried layer 13, it is possible to make the high-frequency serial resistance $R_s$ than in the embodiment of FIG. 4, thereby enhancing the quality factor Q.

Figure 8:
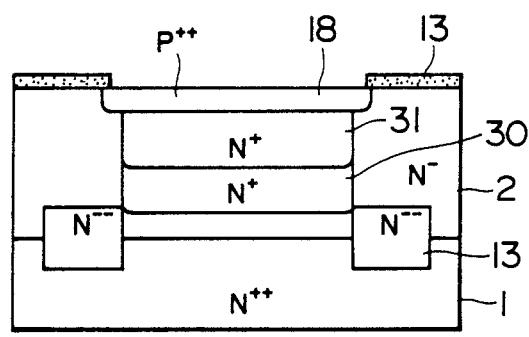
FIG. 8 is a sectional view showing the variable-capacitance diode element according a third embodiment of the present invention.

Referring to FIG. 8, there is shown a third embodiment of this invention, which is similar to the embodiment of FIG. 4 except that the N+ type diffusion layer 16 in FIG. 4 is provided in the form of double-layer comprising N+ type diffusion layers formed with different impurity concentrations by means of ion implantation. Therefore, explanation of the remaining portions of this embodiment will be omitted. Needless to say, it is also possible that the N+ type diffusion layer may be provided in the form of multiple-layer configuration.

As discussed above, with the variable-capacitance diode element according to the present invention, it is possible to greatly improve the saturation tendency of the capacitance-voltage characteristic without causing the high-frequency serial resistance $R_s$ to be increased and without causing the quality factor Q to be lowered, by providing the buried layer 13 in that portion of the semiconductor substrate 1 where the depletion layer occurring below the diffusion layer 16 reaches, instead of changing the thickness t of the epitaxial layer 2.

Furthermore, the thickness t of the epitaxial layer 2 can be decreased by providing the buried layer 13, so that the thickness of the epitaxial layer 2 between the diffusion layer 16 and the semiconductor substrate 1 can be made to be smaller than in the prior art. Thus, the high-frequency serial resistance $R_s$ can be set at a lower value, so that the quality factor Q can be enhanced accordingly.

Still furthermore, by providing the P type diffusion layer in the form of double-layer as in the embodiment of FIG. 6, and by making very thin one of the two layers, or P++ type diffusion layer 26, it is possible to greatly increase the width of the vertically extending depletion layer; thus, the epitaxial layer 2 can be made to be thinner than in the prior art, so that the high-frequency serial resistance $R_s$ can be decreased and thus the quality factor Q can be enhanced.

With the conventional variable-capacitance diode element, the capacitance-voltage characteristic thereof tends to become saturated with a reverse bias voltage of about 20 V, while with the variable-capacitance diode element of this invention, such characteristic does not become saturated until the reverse bias voltage exceeds 25 V. As will be apparent to those skilled in the art, the above-described embodiments of this invention are most effectively applicable to a variable-capacitance diode element which is so designed as to be used with a reverse bias voltage as low as about 2 to 3 volts, since according to the embodiments, the voltage variable range can be widened by restraining the saturation tendency of the capacitance-voltage characteristic.

While the present invention has been illustrated and described with respect to specific embodiments thereof, it is to be understood that the present invention is by no means limited thereto but encompasses all changes and modifications which will become possible within the scope of the appended claims.

I claim:
1. A variable-capacitance diode element, comprising:
   an epitaxial layer provided on a semiconductor substrate of a first conductivity type, said epitaxial layer having the first conductivity type and relatively a lower resistivity than that of said semiconductor substrate;
   a first diffusion layer formed in said epitaxial layer, said first diffusion layer having the first conductivity type and a higher impurity concentration than that of said epitaxial layer;
   at least one second diffusion layer of a second conductivity type which is formed in said first diffusion layer so that PN junction is defined between said first and second diffusion layers; and
   a buried layer formed in boundary portion between said semiconductor substrate and said epitaxial layer where a depletion layer which occurs due to a reverse bias voltage being applied to said PN junction reaches, said buried layer having the first conductivity and a lower resistivity than that of said semiconductor substrate.

2. A variable-capacitance diode element according to claim 1, wherein said second diffusion layer is provided in a two-layer form, one of the two layers being formed in said first diffusion layer, the other one of said two layers covering an exposed portion of a major surface of said first diffusion layer and an exposed portion of a major surface of said one of the two layers.

3. A variable-capacitance diode element, comprising:
   an epitaxial layer provided on a semiconductor substrate of a first conductivity type, said epitaxial layer having said first conductivity type and a relatively lower resistivity than that of said semiconductor substrate;
   a diffusion of the first conductivity type which is formed in said epitaxial layer and has a higher impurity concentration than that of said epitaxial layer;
   at least one diffusion layer of a second conductivity type which is formed in said first conductivity type diffusion layer; and
   a buried layer of the first conductivity type which is formed in a boundary portion between said semiconductor substrate and said epitaxial layer peripherally thereof and except immediately below said first conductivity type diffusion layer, said buried layer having a lower resistivity than that of said semiconductor substrate.

4. A variable-capacitance diode element according to claim 3, wherein said second conductivity type diffusion layer is provided in a two-layer form, one of the two layers being formed in said first conductivity type diffusion layer, the other one of said two layers covering an exposed portion of a major surface of said first conductivity type diffusion layer and an exposed portion of a major surface of said one of the two layers.

5. A variable-capacitance diode element comprising:
   an epitaxial layer provided on a semiconductor substrate of a first conductivity type, said epitaxial layer having the first conductivity type and a relatively lower resistivity than that of said semiconductor substrate;
   a first diffusion layer of the first conductivity type which is provided in said epitaxial layer in a superimposed multi-layer form, said first diffusion layer having a higher impurity concentration than that of said epitaxial layer;
   a second diffusion layer of a second conductivity type which is formed in said first diffusion layer so that PN junction is defined therebetween; and
   a buried layer of the first conductivity type which is provided in a boundary portion between said semiconductor substrate and said epitaxial layer where a depletion layer which occurs due to a reverse bias voltage being applied to said PN junction reaches, said buried layer having a lower resistivity than that of said semiconductor substrate.

* * * * *